United States Patent [19]

Bean et al.

[11] 3,793,712

[45] Feb. 26, 1974

[54] METHOD OF FORMING CIRCUIT COMPONENTS WITHIN A SUBSTRATE

[75] Inventors: Kenneth E. Bean, Richardson; Paul S. Gleim, Dallas, both of Tex.

[73] Assignee: Texas Instruments Incorporated, Dallas, Tex.

[22] Filed: Feb. 26, 1965

[21] Appl. No.: 435,634

[52] U.S. Cl. ........................ 29/577, 29/578, 29/580, 156/17, 148/175

[51] Int. Cl. ........................ B01j 17/00

[58] Field of Search ......29/25.3, 25.3 R, 155.5 G, 29/155.5 I, 578, 580, 577; 148/1.5, 33, 33.2, 33.5, 174, 175, 187; 317/235 AS

[56] References Cited

UNITED STATES PATENTS

| | | | |
|---|---|---|---|
| 2,858,730 | 11/1958 | Hauson | 317/235 AS |
| 2,984,549 | 5/1961 | Roberts | 317/235 AS |
| 3,047,438 | 7/1962 | Marinace | 148/33.5 X |
| 3,133,840 | 5/1964 | Gibson | 156/17 X |
| 3,243,323 | 3/1966 | Corrigan | 148/175 |
| 3,265,542 | 8/1966 | Hirshon | 148/175 |
| 3,290,753 | 12/1966 | Chang | 29/25.3 |
| 3,300,832 | 1/1967 | Cave | 29/25.3 |

OTHER PUBLICATIONS

"Journal of the Electrochemical Society," Vol. 110, No. 5, May 1963, pp. 388–393

"Electronics Review," Vol. 37, No. 17, June 1, 1964, p. 23.

"Metallurgy of Elemental and Compound Semiconductors" published 1961 by Interscience Publishers, New York, TK7872–S4C5, pp. 246 and 286.

*Primary Examiner*—W. C. Tupman

*Attorney, Agent, or Firm*—Gary C. Honeycutt; Hal Levine; Jim Comfort

[57] ABSTRACT

Disclosed is a method of etching a cavity in a semiconductor body and redepositing semiconductor material in the cavity formed thereby such that a uniform cavity is formed thereby allowing a uniform fill of semiconductor material resulting in a planar surface by use of a semiconductor body with a crystal orientation other than (111). Also is disclosed the structure formed by the method.

7 Claims, 16 Drawing Figures

Fig. 4a (III) orientation

BY John G. Graham
ATTORNEY

Kenneth E. Bean
Paul S. Gleim
INVENTORS

BY John W. [signature]

Kenneth E. Bean
Paul S. Gleim
INVENTORS

BY John D. Graham

METHOD OF FORMING CIRCUIT COMPONENTS WITHIN A SUBSTRATE

This invention relates to a process for making semiconductor devices, and more particularly to the process of selectively etching and epitaxially redepositing semiconductor material within a semiconductor substrate having a crystal orientation other than the (111).

In the area of semiconductor technology, and in particular the area of integrated circuits, it is desirable to form individual active and/or passive components within a single crystal semiconductor material. In accordance with this objective, various methods and techniques have been developed with a view to maintaining a high degree of control over the depth, conductivity and lateral extent of the doped regions of the components above mentioned. Diffusion techniques using oxide masking offer excellent geometrical control and have gained wide acceptance. However, diffusion of impurities does not permit complete control of the impurity concentration, because the distribution does not always follow a certain gradient, and because a second or third diffusion must always be of a higher concentration than the first if the conductivity-type is to be converted. For these reasons epitaxial deposition has been employed in the semiconductor arts to produce semiconductor regions having uniform and controlled impurity concentrations. In particular, a technique has been developed whereby a semiconductor wafer has only portions of its surface masked with an oxide so that only desired segments of the substrate are exposed. The exposed portions of the substrate are then subjected to an etching process, thereby removing specified amounts of semiconductor material and producing vacant areas or "pockets" within the substrate. Thereafter, using an epitaxial process, layers of semiconductor material of desired conductivity type are redeposited within these pockets. The use of this selective etching and redeposition process not only allows close control to be maintained over the impurity concentration of the semiconductor material, but also over the dimensions and configuration of these layers.

There are problems associated with this process, however, in respect to single crystals having a (111) orientation that limit its use and application. It has been discovered that when such a crystal is masked with the oxide and then selectively etched, there will be a so-called preferential etching of the semiconductor material, resulting in an irregular etch profile within the "pockets." Consequently, when the subsequent deposition step is carried out within these pockets, there will be an irregular and uneven epitaxial growth corresponding to the irregular and uneven etch profile, thereby producing a surface that is not planar. Since many semiconductor applications, in particular the fabrication of monolithic networks, require a planarity of surface in order to allow correct mask alignments, uniform diffusions, and continuity of leads deposited across the surface, the uneven epitaxial growth severely hinders these objectives.

Moreover, research and investigations which directly resulted in the process of this invention, have shown that the previous difficulties encountered by others lie in the orientation of semiconductor material that has been used for the substrate upon which the selective etch and deposition is carried out. The monocrystalline semiconductor material that is generally used in the semiconductor industry today, and in particular in the area of integrated circuits, has a crystal orientation identified by the (111) Miller indices. The process of this invention, however, involves using monocrystalline semiconductor material, particularly silicon, having a crystal orientation other than the (111) as the substrate upon which a selective etch and subsequent epitaxial deposition may be performed. Although there have been very limited applications using semiconductor material having such an orientation, the advantages of doing so in the context of this invention has heretofore been unknown.

It is then an object of this invention to provide a method of selective etching of a semiconductor substrate where the etch profile of the pockets is flat and regular.

It is another object to provide such an etch profile so that subsequent epitaxial depositions into these pockets will result in regions of semiconductor material having planar surfaces.

The novel features believed characteristic of this invention are set forth in the appended claims. The invention itself, however, showing the importance of using crystal orientations other than the (111) as well as other objects and advantages thereof, may best be understood by reference to the following detailed description of illustrative embodiments, when read in conjunction with the accompanying drawings, wherein:

Figures 2, 2A, 3, 3A, 4:
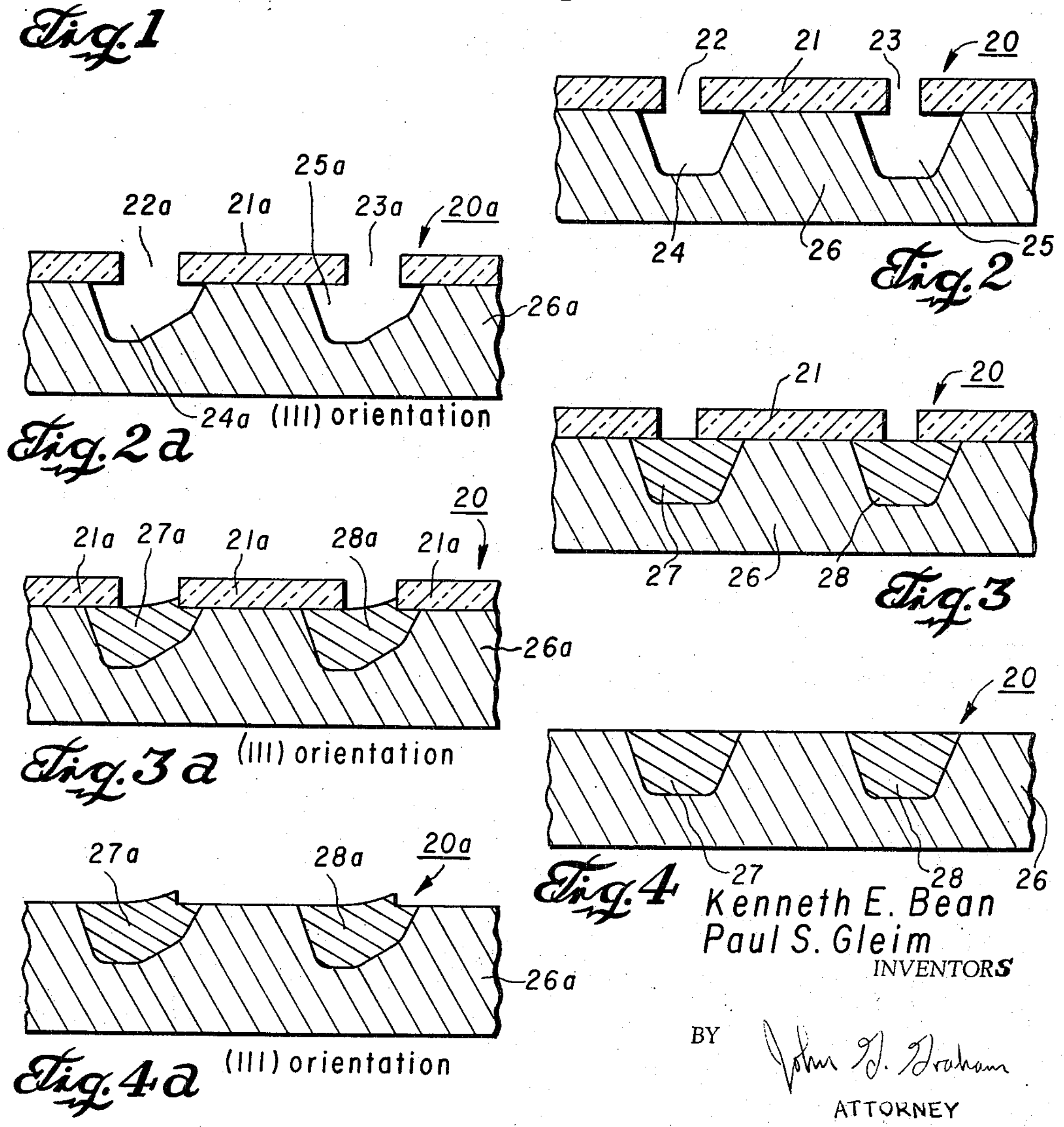
FIG. 2 is a cross-sectional view of a wafer having a crystal orientation other than (111) which has been subjected to a selective etch.
Figures 5, 6:
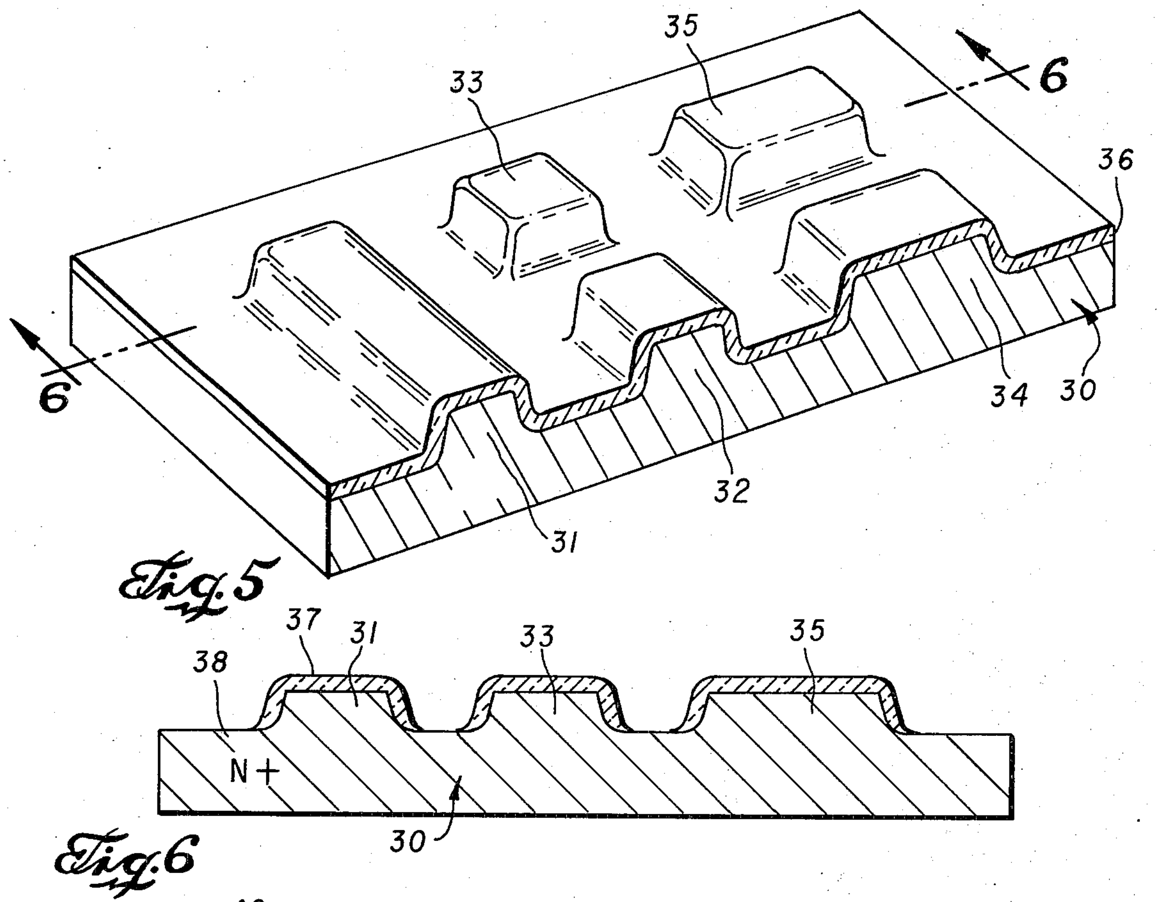
Figure 7:
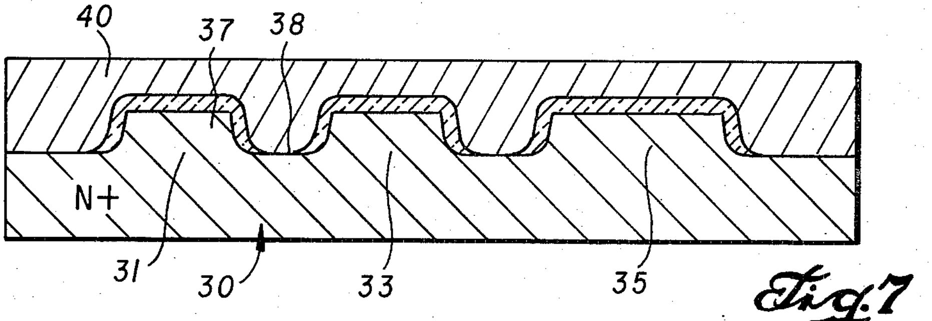
Figure 8:
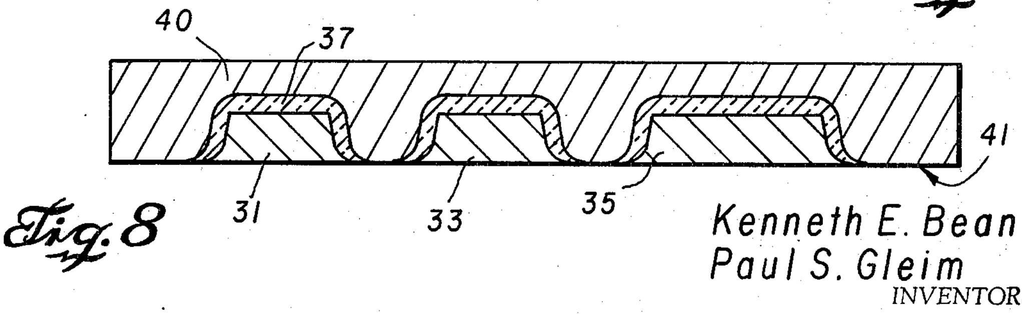
Figure 9:
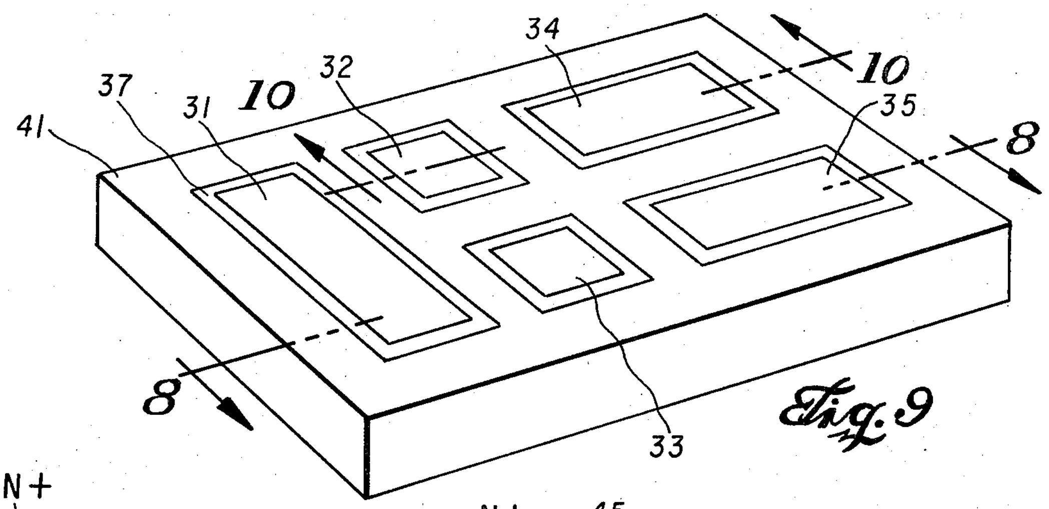
Figures 10, 11, 12, 13:
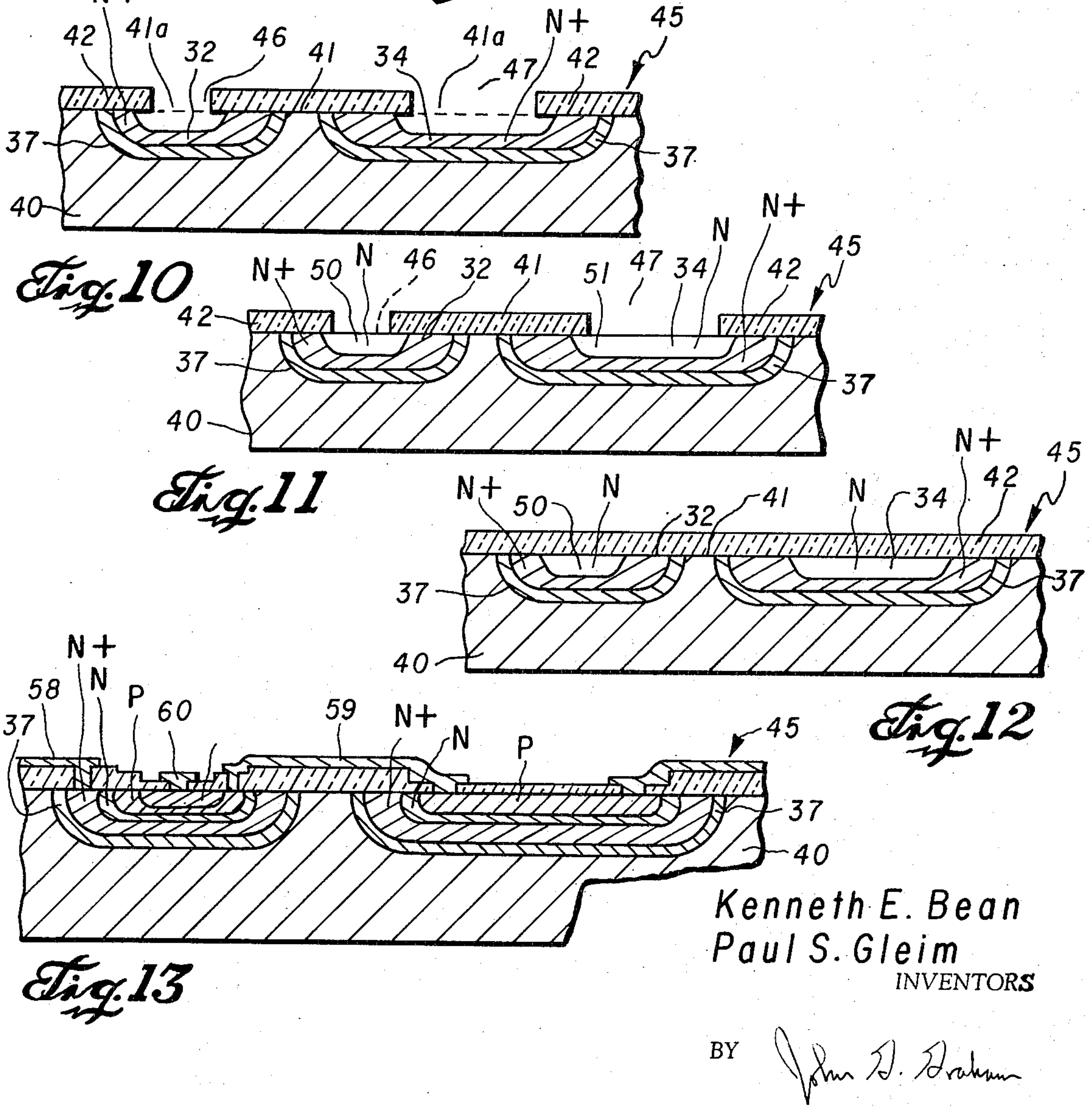

FIG. 2*a* is a cross-sectional view of a wafer having a crystal orientation of (111) which has been subjected to a selective etch;

FIG. 3 is a cross-sectional view of a wafer having a crystal orientation other than (111) after regions of semiconductor material have been epitaxially grown within the "pockets" of the wafer;

FIG. 3*a* is a cross-sectional view of a wafer having a crystal orientation of (111) after regions of semiconductor material have been epitaxially grown within the "pockets" of the wafer;

FIG. 4 is a cross-sectional view of the wafer of FIG. 3 after the oxide mask has been removed;

FIG. 4*a* is a cross-sectional view of the wafer of FIG. 3*a* after the oxide mask has been removed;

FIG. 5 is an isometric pictorial view in section of a semiconductor wafer in an early stage of manufacture of an integrated circuit showing one application of the process of the present invention;

FIGS. 6–8 are elevational views in section of the semiconductor body of FIG. 5 in successive stages of production;

FIG. 9 is an isometric pictorial view of the lower side of the semiconductor body of FIG. 8;

FIGS. 10–12 are sectional views of a portion of the wafer of FIG. 9 taken along the line 10—10 showing the final steps of the manufacture of an integrated circuit using the process of this invention;

FIG. 13 shows a transistor and resistor formed by the process of this invention.

Since the novelty and utility of this invention reside in the orientation of semiconductor material used for the substrate upon which the selective etch and epitaxial deposition is performed, rather than in the actual process of selective etching and redepositing, various techniques known in the art and various types of apparatus may be used to accomplish the actual steps of forming an oxide mask over the surface of a semiconductor substrate, removing a select portion of the substrate by etching the unmasked region, and epitaxially redepositing semiconductor material within the unmasked region. In particular, however, it is desirable to use a process which brings the transformation from an etching condition to a depositing condition as smoothly as possible and with a minimum of cost. In line with this objective, therefore, there is presently described a process whereby a number of silicon semiconductor wafers having a crystal orientation other than that defined by the (111) Miller indices have masks of silicon oxide, for example, formed upon their respective surfaces. The wafers are then placed within a reactor wherein the reactor constituents, during etching, are substantially the same as those during the epitaxial deposition. The basic formula for this operation is $SiCl_4 + 2\ H_2 \overset{\Delta}{\rightleftarrows} 4\ HCl + Si$. This reaction is forced to the left by the addition of HCl, thus creating an etching condition. To change from an etching condition to one of deposition merely calls for the termination of the HCl flow which, in turn, brings about a gradual change from an etching condition to one of deposition.

Figure 1:
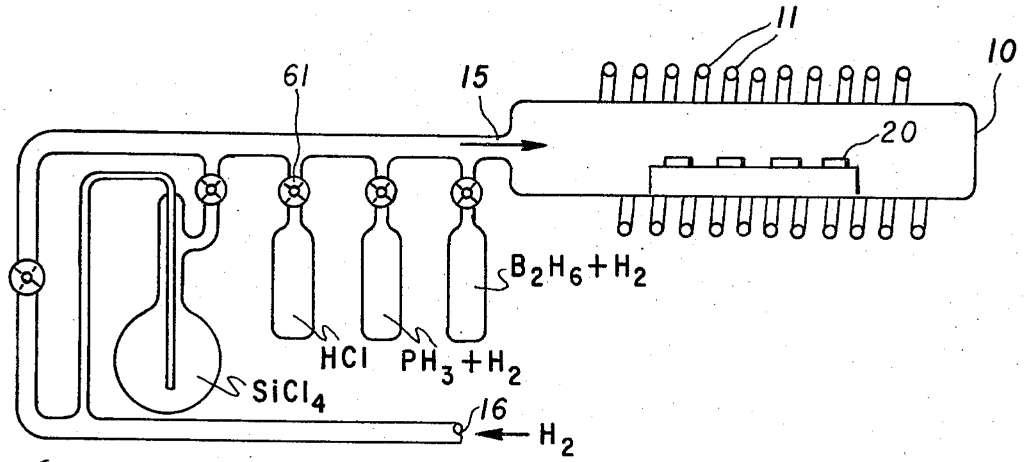
FIG. 1 shows one form of apparatus used in the process of this invention.

Referring to FIG. 1, apparatus for etching and redepositing in accordance with this process comprises a reactor in the form of a tube furnace 10 having heating coils 11. The furnace may be of a horizontal or vertical type, may be suited for single or multiple slices, and may be either resistively or inductively heated. The silicon wafers 20, having a crystal orientation other than the (111), such as the (110), for example, and having the oxide masks upon their surfaces, are disposed within the furnace in such a position as to be exposed to gases directed into the tube furnace through a conduit 15. The hydrogen chloride vapor is introduced into the conduit 15 from a cylinder containing anhydrous HCl. The silicon tetrachloride vapor is introduced into the conduit 15 by bubbling purified dried hydrogen ($H_2$) through liquid silicon tetrachloride contained in a flask as shown. The purified dried hydrogen enters an end 16 of the conduit. The flow of the gases into the tube furnace 10 is regulated by conventional valves.

With the valves adjusted so that an excess of hydrogen chloride vapor is introduced into the reactor, the wafers 20 are subjected to a selective vapor etch resulting in the structure shown in FIG. 2. While the oxide mask 21 will be substantially unaffected, select portions of the (110) monocrystalline substrate 26 below the oxide apertures 22 and 23 are removed in the manner shown. The etchant itself comprises a mixture of silicon tetrachloride, hydrogen chloride, and hydrogen. Alternatively, the valve controlling the flow of silicon tetrachloride may be closed, and an etchant comprising hydrogen chlordie and hydrogen may successfully be used to remove the (110) silicon substrate 26.

The rate of etching as well as the dimensions of the etched regions will largely be determined by the configuration and size of the oxide masking 21, the temperature at which the reactor is maintained, the flow rate through the conduit 15, and the percentage composition of the etchant. For example for one particular configuration of the oxide mask 21, when the flow rate was kept at 30 liters/minute, the temperature at approximately 1200° C, and the etchant consisted of 95% $H_2$ and 5% HCl, the silicon substrate 26 etched at a rate of approximately 0.22 microns/second.

After the desired amount of the silicon substrate has been removed by the above-described process, valve 61 is closed to terminate the flow of the hydrogen chloride, the gas flow through the conduit 15 now consisting of hydrogen and silicon tetrachloride. Doping is accomplished by introducing an appropriate impurity-containing compound such as phosphene ($PH_3$) for N-type doping, or diborane ($B_2H_6$) for P-type doping. These compounds are stored in cylinders filled with hydrogen as a carrier gas as shown in FIG. 1, and are interjected in the main gas stream by adjusting the appropriate valves. With this arrangement, and due to the hydrogen reduction of the silicon tetrachloride, N-type or P-type silicon is grown upon the substrate 26 within the "pockets" 24 and 25 to form the regions 27 and 28, shown in FIG. 3.

Referring to FIG. 2, it has been observed that the "pockets" 24 and 25 below the apertures 22 and 23, respectively, have regular etch profiles with flat bases, as shown. Consequently, when the subsequent epitaxial deposition is carried out, as depicted in FIG. 3, and the oxide mask 21 is removed, the regions 27 and 28 are substantially flat, thereby providing a planar surface, as shown in FIG. 4, upon which subsequent device fabrication may proceed. On the other hand, the etch profiles of FIG. 2 should be compared with the profiles of the "pockets" **24*a* and 25*a* below the apertures 22*a* and 23*a* respectively, depicted in FIG. 2*a*. Looking at this figure, which represents a portion of a wafer 20*a* where the substrate 26*a* has a crystal orientation of (111), and has been subjected to the identical etching process as the wafer 20 of FIG. 2, it is observed that these etch profiles are irregular and do not have flat bases. This variance between the two sets of etch profiles is due primarily to the fact that the etchant will preferentially etch the (111) oriented substrate 26*a*, while the etching process will be even and nonpreferential on the (110) oriented substrate 26 of FIG. 2. As a result of these irregular etch profiles on the (111) substrate, any subsequent epitaxial growth within the "pockets" 24*a* and 25*a* will also be irregular as observed in FIG. 3*a* by the regions 27*a* and 28*a*. Consequently when the oxide mask 21*a* is removed from the wafer 20*a*, as noted in FIG. 4*a*** the surface of the wafer will not be planar.

Although the above description has been referenced to etching and epitaxially redepositing upon a (110) crystal orientated substrate, as contrasted to etching and epitaxially redepositing upon a (111) crystal oriented substrate, applicants have also submitted semiconductor substrates having other crystal orientations, such as the (100) orientation and the (311) orientation, to a selective etch and epitaxial regrowth, and the same regular etch profiles and planar surfaces depicted in FIGS. 2–4 were also characteristic of these orientations. Consequently, by using semiconductor material having an orientation other than the (111), irregular etch profiles and nonplanar growth surfaces may be avoided.

The process of this invention then becomes very important, especially in the production of monolithic networks, since planarity of surface must be maintained in order to allow accurate mask alignments, uniform diffusions, and continuity of leads across the surface of the wafers. Accordingly, the above-described process will have considerable utility whenever any of these objectives are desired.

There is now described one particular application of the process of this invention which constitutes an improvement over the application of Earl Alexander and Walter R. Runyan, Ser. No. 435,633, (now U.S. Pat. No. 3,587,166) filed concurrently with the present application and assigned to the assignee of the present invention. In this copending application a novel method of isolation in integrated circuits is described utilizing the steps of etching a portion of a semiconductor substrate through an oxide mask, and then epitaxially redepositing within the unmashed areas. As pointed out in that application, such a technique is extremely useful for fabricating circuit components joined by a common substrate, but yet electrically isolated through the substrate.

By using the process of this invention in conjunction with the process disclosed by the above-mentioned copending application, an improved structure may be fabricated as will now be described. Referring to FIG. 5, a slice of single-crystal low resistivity of N+ semiconductor material, such as silicon, having a resistivity of perhaps 0.010 to 0.025 Ω/cm is used as the starting material. In accordance with this invention, the starting material must have a crystal orientation other than the (111). This slice may be about one inch in diameter and ten mils thick. A small segment of the slice may be represented as a chip, or wafer 30, which represents the segment occupied by one integrated circuit. Actually, the slice would contain dozens or even hundreds of the segments such as the wafer 30. The top surface of the slice is first masked and etched to form a pattern of raised mesas 31–35. The masking may be by a material such as wax, or preferably by the photoresist techniques which permit excellent geometry control. The height of the mesas 31–35, or in other words the depth of the etching, may be about 2 mils. At this point the top surface of the slice is covered with an oxide coating 36, silicon oxide for example, which may be formed by any conventional technique to a thickness of perhaps 10,000 A. For instance, the coating 36 may be thermally grown by exposing the slice to steam at about 1200° C. The mesas are now masked with photoresist and the oxide coating selectively removed in the surrounding areas by etching, leaving oxide layers 37 on each mesa, as seen in FIG. 6. The top surface of the slice is then cleaned to remove all traces of oxide, organics from the photoresist, and other contaminants from the uncoated areas 38, and the slice is placed in an epitaxial reactor to produce the top layer which eventually becomes the substrate.

Within the reactor, a layer 40 of semiconductor material is deposited over the top surface of the slice 30 as seen in FIG. 7. The most common method of epitaxial deposition is by the hydrogen reduction of silicon tetrachloride, a technique well known in the art which requires no elaboration here. This epitaxial growth begins in the areas 38 since the semiconductor material does not adhere to the silicon oxide layers 37. After the thickness of the grown layer reaches the tops of the mesas, however, subsequent growth will spread out over the entire surface to produce a generally flat top face on the layered assembly. The conductivity-type of the layer 40 is not critical as it may be N-type, P-type, or intrinsic, and the thickness of the layer should be perhaps three or four mils or more to facilitate handling the unit without breakage.

Although one method of depositing the layer 40 has been described, this is by no means restrictive, as other methods well known in the art for depositing semiconductor material may be used in the process of this invention. Also, even though the term epitaxial has been used, implying a continuation of crystalline orientation from the slice to the grown layer, this need not be the case since the grown layer may also be either polycrystalline or amorphous.

As the next step in the process of this invention the structure of FIG. 7 is subjected to a lapping and polishing treatment on its lower face to remove all of the original N+ material except that portion remaining within the mesas 31–35 as illustrated in FIG. 8. It is to be noted, as a particular aspect of this invention, that the degree of lapping is not critical, and although FIG. 8 depicts the surface of face 41 as being perfectly flat, and the regions of unremoved N+ material within the mesas being of identical depth, in practice it would be impractical, if not impossible, to achieve such close tolerances. Moreover, since the dimensions of the N+ layers within the mesas 31, 33, and 35 do not seriously affect the operating parameters of the devices subsequently to be formed within these areas, there is no requirement for precise lapping.

Inverting the device and looking at what was the bottom surface or face 41 of FIG. 8, but will now be considered the top face of the unit, the structure will appear as in FIG. 9. Each of the low resistivity N+ monocrystalline portions 31–35 is insulated from the others and from the substrate or layer 40 by the silicon oxide coating 37. This oxide layer 37 is not shown to scale in the drawings, and would actually be perhaps an order of magnitude thinner in proportion than is shown in the sectional views of the figure.

An oxide layer 42 is then formed upon the upper surface or face 41 of the wafer 45, as depicted in FIG. 10. The oxide layer, which might be silicon oxide for example, should preferably be of a thickness in excess of 10,000 A, and may be formed by any conventional technique. For example it may be thermally grown by heating the entire structure to a temperature of approximately 1300° C in the presence of oxygen.

Through the use of photographic masking and etching techniques, for example, a select portion of the oxide layer 42 is removed so as to expose a corresponding portion of the low resistivity semiconductor regions 32 and 34 within the apertures or windows 46 and 47, respectively. This removal may be accomplished by covering the oxide layer 42 with photoresist, exposing and developing the photoresist, and etching away the unmasked areas of the oxide. By this method, the oxide mask shown in section in FIG. 10 is produced directly on the substrate surface 41. The mask thus produced will limit the area of the substrate that is to be affected by the subsequent vapor etch and epitaxial redeposition steps.

As the next steps in the process of the present invention the wafer 45 is subjected to a selected vapor etch which removes a desired portion of the low resistivity regions 32 and 34 below a dotted line 41a as observed in FIG. 10. The wafer 45 is thereafter subjected to an epitaxial deposition step whereby, as shown in FIG. 11, regions 50 and 51 of high resistivity N-type semiconducting material are redeposited within the vacant areas produced by the vapor etch step. The N-type regions 50 and 51 are formed adjacent the low resistivity N+ regions 32 and 34 also depicted in FIG. 11.

The layers 50 and 51 may now serve as active regions into which subsequent diffusions may be made in order to fabricate various components of an integrated circuit. In accordance with this objective, the oxide layer 42 is regrown over the top surface of the wafer 45, as shown in FIG. 12. Thereafter through a series of photographic masking and etching steps combined with conventional diffusion operations, the N-P-N transistor and the resistor depicted in FIG. 13 is formed within the substrate 40. Ohmic contacts 58, 59 and 60 are then attached to the collector, base, and emitter regions, respectively. The transistor and resistor are electrically isolated from each other by the oxide layers 37, the only contact between the two being th lead 50 on the surface of the wafer 45. Due to the process of this invention, the layers 50 and 51 into which the subsequent diffusions were carried out, have a planar surface, allowing accurate alignment of the masks used in the fabrication of the transistor and resistor, uniform diffusion of the regions of these devices, and placement of continuous leads or contacts across the surface of the wafer.

Although FIG. 13 shows a transistor and resistor formed within a single substrate using the process of this invention, it is to be pointed out that these structures are by no means restrictive as other circuit elements may similarly be formed. Similarly, the doping characteristics of initial substrate material is not critical and may either by N+ or P+.

The broad concept of this invention, that is the selective etching of and epitaxially redepositing semiconductor material on a semiconductor substrate having a crystal orientation other than the (111), is not to be restricted to any one type of semiconductor material, such as silicon, or to any one type of etching, such as vapor etching. On the contrary, it is intended to cover all types of semiconductor material having appropriate characteristics and all types of chemical etching.

While the invention has been described with reference to specific methods and embodiments, it is to be understood that this description is not to be construed in a limiting sense. Various modifications of the disclosed embodiments, as well as other embodiments of the invention, may become apparent to persons skilled in the art without departing from the spirit and scope of the invention as defined by the appended claims.

What is claimed is:

1. In a method of fabricating a circuit component in one surface of a body of semiconductor material said surface having a crystal orientation other than the (111), the steps of:

a. forming a mask upon said surface of said body of semiconductor material, thereby to expose a selected portion of said material, b. etching a predetermined amount of said selected portion of said material, whereby a pocket is formed within the body, said pocket having a regular etch profile and flat base, and c. epitaxially depositing a region of semiconductor material substantially within the pocket formed by said etching, the resultant epitaxial deposit a surface planar with said surface of said body of semiconductor material.

2. In a method of fabricating a circuit component in one surface of a body of semiconductor material said surface having a crystal orientation other than the (111), the steps of:

a. forming a mask upon said surface of said body of semiconducting material, thereby to expose a selected portion of said material, b. applying a vapor etch to said mask and said selected portion of said material for a period of time sufficient to remove a predetermined amount of said selected portion, whereby a pocket is formed within the body, said pocket having a regular etch profile and flat base, and c. epitaxially depositing a region of semiconductor material substantially within the space occupied by said removed material, the resultant epitaxial deposit having a surface planar with said surface of said body of semiconductor material.

3. A method for fabricating individual circuit components within a semiconductor body, said components being electrically isolated from each other through the body, comprising the steps of:

a. providing a wafer of low resistivity semiconductor material, the crystal orientation of a face of said wafer being other than the (111), b. forming a plurality of mesa regions upon said wafer face, c. forming a layer of insulating medium over each of said mesa regions, d. depositing a body of semiconductor material upon said wafer, thereby to completely cover the layers of said insulating medium, e. removing substantially all of the low resistivity semiconductor material except the portion which forms the mesa regions, f. forming a mask on said wafer face thereby to expose the surface of a selected portion of said low resistivity semiconductor material, g. etching a predetermined amount of said selected portion, whereby a pocket is formed within the unetched amount of said selected portion, said pocket having a regular etch profile and flat base, and said pocket having a side wall which together with said flat base are defined by said low resistivity semiconductor material, h. epitaxially depositing regions of high resistivity semiconductor material within the space previously occupied by said etched amount said regions of high resistivity each having a surface planar with said wafer face and being spaced from said insulating medium by said low resistivity semiconductor material, and i. forming individual circuit components within said regions of high resistivity semiconductor material.

4. In a method of fabricating a circuit component within a body of semiconductor material, comprising the steps of: forming a mask upon a surface of said body of semiconductor material oriented in the (100) plane, said mask having an aperture exposing a selected portion of said surface, applying an etch for said mask and said selected portion of said surface for a period of time sufficient to remove a predetermined amount of said selected portion, epitaxially depositing semiconductor material substantially within the space formed by the removal of said portion of material thereby producing a deposit having a surface planar with said surface of said body of semiconductor material and forming a circuit component within the deposited region of semiconductor material.

5. In a method of fabricating a circuit component within a body of semiconductor material, comprising the steps of: forming a mask upon a surface of said body of semiconductor material oriented in the (110) plane, said mask having an aperture exposing a selected portion of said surface, applying an etch to said mask and said selected portion of said surface, for a period of time sufficient to remove a predetermined amount of said selected portion, epitaxially depositing semiconductor material substantially within the space formed by the removal of said portion of material thereby producing a deposit having a surface planar with said surface of said body of semiconductor material, forming a circuit component within said deposited region of semi-conductor material.

6. In a method of fabricating a plurality of circuit components within a body of semiconductor material, comprising the steps of: forming a mask upon a surface of said body of semiconductor material oriented in the (100) plane, said mask having a plurality of apertures exposing selected portions of said surface, applying an etch to said mask and said selected portions of said surface for a period of time sufficient to remove a predetermined amount of said selected portions, epitaxially depositing semiconductor material substantially within the spaces formed by the removal of said portions of material thereby producing a deposit having a surface planar with said surface of said body of semiconductor material, forming a plurality of circuit components within said deposited regions of semiconductor material.

7. In a method of fabricating a plurality of circuit components within a body of semiconductor material comprising the steps of: forming a mask upon a surface of said body of semiconductor material oriented in the (110) plane, said mask having a plurality of apertures exposing selected portions of said surface, applying an etch to said mask and said selected portions of said surface for a period of time sufficient to remove a predetermined amount of said selected portions, epitaxially depositing semiconductor material substantially within the spaces formed by the removal of said portions of material thereby producing a deposit having a surface planar with said surface of said body of semiconductor material, and forming a plurality of circuit components within said deposited regions of semiconductor material.

* * * * *